United States Patent [19]
Friedrich et al.

[11] Patent Number: 5,952,950
[45] Date of Patent: Sep. 14, 1999

[54] ADAPTABLE ANALOG SIGNAL CONVERSION

[75] Inventors: Mark Peter Friedrich, Clinton Township; Stephen Mark Jackson, Canton, both of Mich.

[73] Assignee: Ford Motor Company, Dearborn, Mich.

[21] Appl. No.: 08/925,498

[22] Filed: Sep. 8, 1997

[51] Int. Cl.⁶ .................................................. H03M 1/60
[52] U.S. Cl. ................................................................ 341/157
[58] Field of Search ....................................... 341/157, 138, 341/133, 124; 327/393, 80

[56] References Cited

U.S. PATENT DOCUMENTS 5,077,555  12/1991  Weber .

*Primary Examiner*—Brian Young
*Attorney, Agent, or Firm*—Donald A. Wilkinson

[57] ABSTRACT

This invention relates to a microcomputer used to bias an analog signal conversion circuit. The microcomputer is programmed to select between one of two possible signal processing configurations. This is done rather than populating or depopulating components on the module, thus changing the hardware configuration.

5 Claims, 3 Drawing Sheets

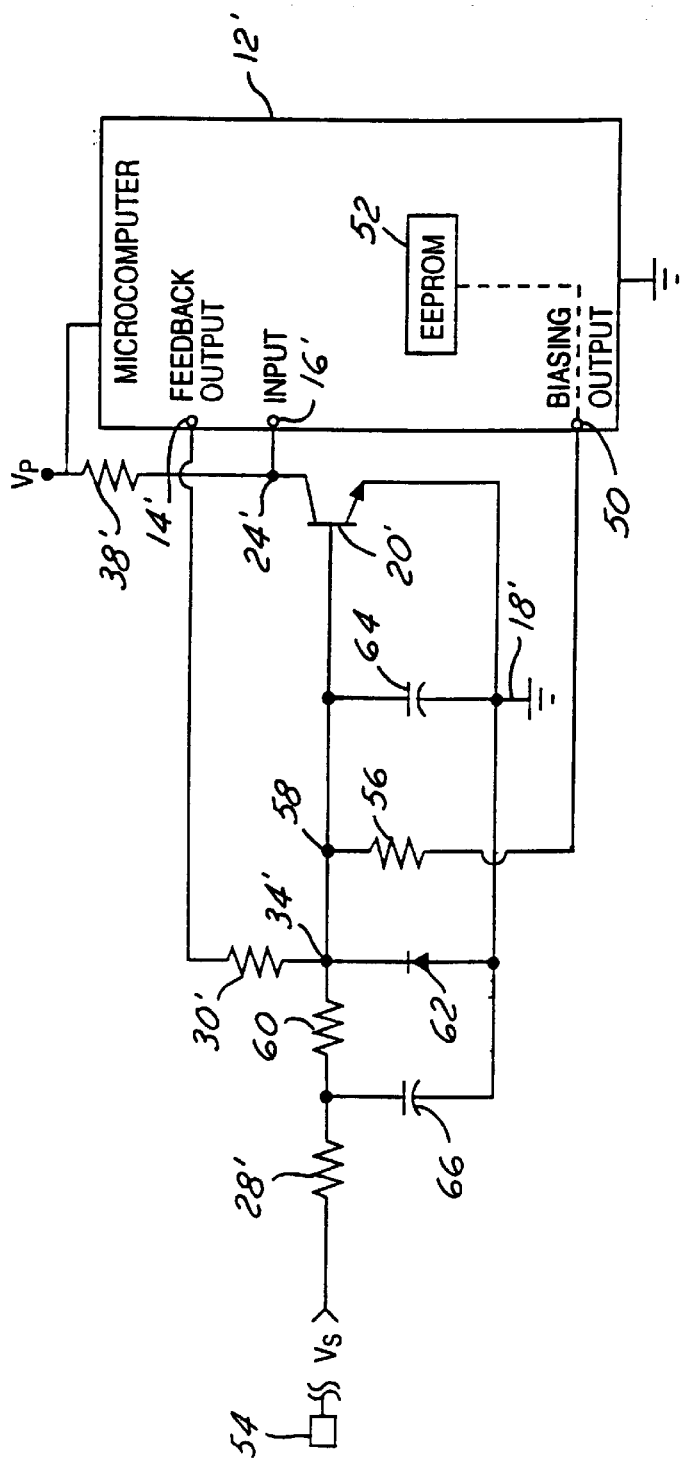
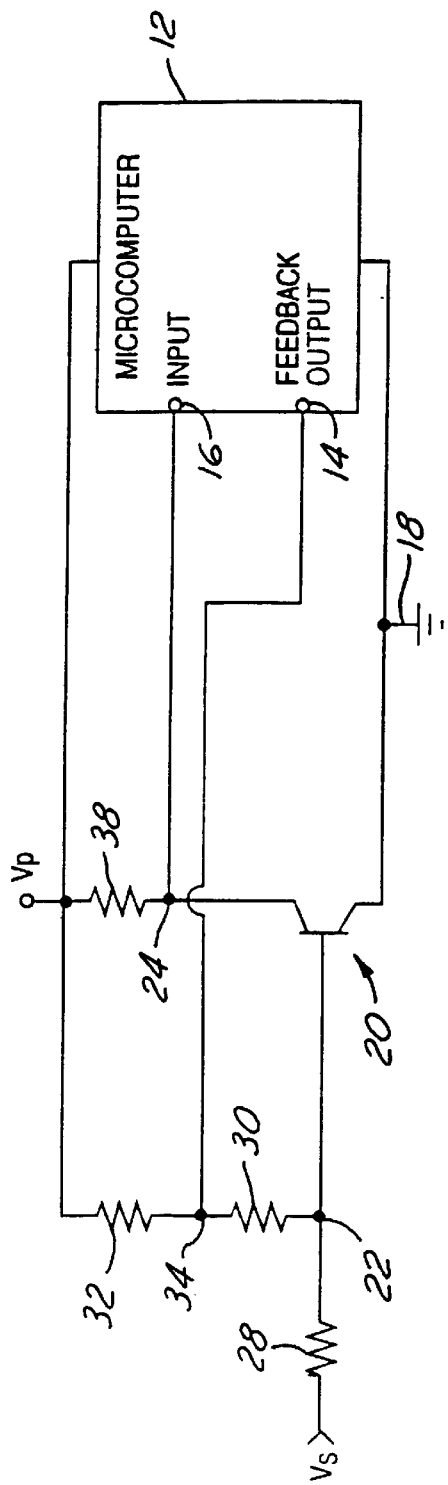
FIG. 1
FIG. 2 (PRIOR ART)

ADAPTABLE ANALOG SIGNAL CONVERSION

FIELD OF THE INVENTION

This invention relates to signal detection with hysteresis, and more particularly to a circuit for signal detection with programmable variation.

BACKGROUND OF THE INVENTION

Conversion of an analog signal into a two-state signal is necessary before digital processing. For example, in automobile applications, a sensor coupled to a vehicle drivetrain provides an analog signal having a frequency related to vehicular speed. After conversion to a digital signal, a microcomputer detects the time interval of each cycle and computes vehicular speed by conventional algorithms.

It is known to provide a circuit for conditioning an input signal to a microcomputer utilizing hysteresis comparison. A circuit is provided for translating a signal into a two-state input signal for use by a microcomputer. The circuit comprises: summing means for adding electrical energy to the signal in response to a first feedback state of a feedback control signal to generate an intensified signal and for subtracting electrical energy from the signal in response to a second feedback state of the feedback control signal to generate a diminished signal. Controller means is coupled to the summing means for recognizing a first input state of the signal when the diminished signal exceeds a predetermined value and for recognizing a second input state of the signal when the intensified signal falls below the predetermined value. The controller means generate the feedback control signal, having the first feedback state when the diminished signal exceeds the predetermined value and having the second feedback state when the intensified signal falls below the predetermined value.

By subtracting electrical energy from the signal to generate a diminished signal, a relatively large positive excursion in the signal is required before a logic "1" is recognized. Similarly, by adding electrical power to generate an intensified signal after a logic "1" is recognized, a relatively large negative excursion in the signal is required before a logic "0" is recognized.

It is also known to use summing means for adding electrical energy to the signal in response to a first feedback state of a feedback control signal to generate an intensified signal and for subtracting electrical energy from the signal in response to a second feedback state of the feedback control signal to general a diminished signal. Switching means are responsive to the summing means for providing a negative edge interrupt signal when the diminished signal exceeds a predetermined value and for providing a positive edge interrupt signal when the intensified signal falls below the predetermined value. Microcomputer means are responsive to the switching means for generating the feedback control signal having the first feedback state in response to the negative edge interrupt signal and having the second feedback state in response to the positive edge interrupt signal. Preferably, after recognizing an interrupt transition, the microcomputer means disregard further changes in the interrupt signals until after generating the feedback output.

For some applications of this circuitry, there may be two or more types of analog to digital conversions needed if different sensors are employed to generate the analog signal, necessitating multiple hardware configurations, each adapted for a different conversion. Different electronic modules, then, containing the circuits would be needed. It would be desirable to achieve selective conversion of analog to digital signals without the need to have two different hardware configurations. More than one hardware configuration adds undesired cost and complexity for these converters.

SUMMARY OF THE INVENTION

In accordance with an embodiment of this invention, the present invention contemplates a method for programmable biasing of an analog to digital conversion circuit comprising the steps of: biasing an analog signal conversion circuit including a resistor always populated and connected between the base of a switching transistor and a configurable port of a microcomputer; and selecting the microcomputer port as one of either an output biased low, effectively creating the populated condition, and a high impedance input, effectively creating a depopulated condition.

Accordingly, an object of the present invention is to provide a microcomputer of an electronics module that is used to bias an analog signal conversion circuit to allow the use of one of two different types of sensors for generating the analog signal. Information indicating one of two states is stored in the microcomputer. When the microcomputer is activated, the microcomputer generates an output which causes one of two bias signals to be applied to a switching transistor. Thus, the circuit is properly configured to produce a signal in response to a selected one of two possible input signals from the respective sensors without changing the hardware.

An advantage of the present invention is that module complexity is reduced by programming the microcomputer to allow the circuit to account for different sensors rather than populating or depopulating components on the module.

BRIEF DESCRIPTION OF THE DRAWINGS

FIG. 1 is a schematic diagram of a circuit in accordance with an embodiment of this invention;

FIG. 2 is an electrical schematic of a circuit in accordance with the prior art;

DETAILED DESCRIPTION OF THE PREFERRED EMBODIMENTS

Figure 3A:
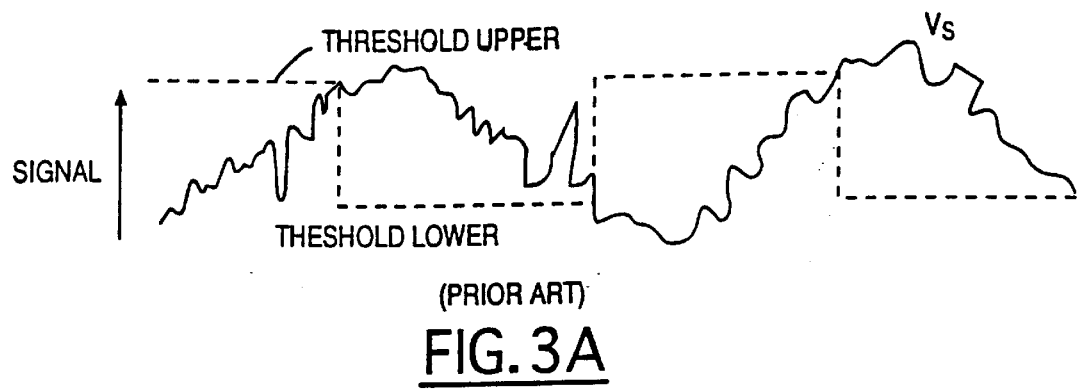
FIGS. 3A–3D represent various prior art electrical waveforms associated with the embodiment shown in FIG. 2.

FIG. 2 illustrates a prior art circuit described in U.S. Pat. No. 5,077,555 to Weber, incorporated herein by reference. A controller such as microcomputer 12, an off-the-shelf device sold by Motorola as Part No. MC68HC05 in this example, is shown coupled to signal $V_s$ through circuitry described in greater detail hereinafter. For this particular example, a speed sensor (not shown) coupled to the engine drive train (not shown) generates analog signal $V_s$ having a frequency related to vehicular speed. After the signal conditioning described below, microcomputer 12 calculates vehicular speed in a conventional manner by first computing elapsed time between two corresponding edge transitions of signal $V_s$.

Microcomputer 12 is shown connected to a conventional power source ($V_p$) and a signal return, shown as ground 18. Feedback output 14 provides a two-state output responsive to input 16. For the example shown herein, microcomputer 12 recognizes a logic "1" state when the voltage at input 16 is above one-half $V_p$ and recognizes a logic "0" state when the input voltage is below one-half $V_p$. Feedback output 14 is set near ground potential when input 16 is at a logic "1" and set at a high impedance, essentially open, when input 16 is at a logic "0".

Switching transistor 20, a bipolar NPN transistor in this example, is shown having a control or base electrode connected to node 22, an output or collector electrode connected to node 24, and another output or emitter electrode connected to signal ground 18. Node 22 is also shown connected to signal $V_s$ via a series resistor 28. Resistors 30 and 32 are shown connected in series through node 34. The series interconnection of resistors 30 and 32 is connected between node 22 and $V_p$. A resistor 38 is shown connected between node 24 and $V_p$.

Figure 3B:
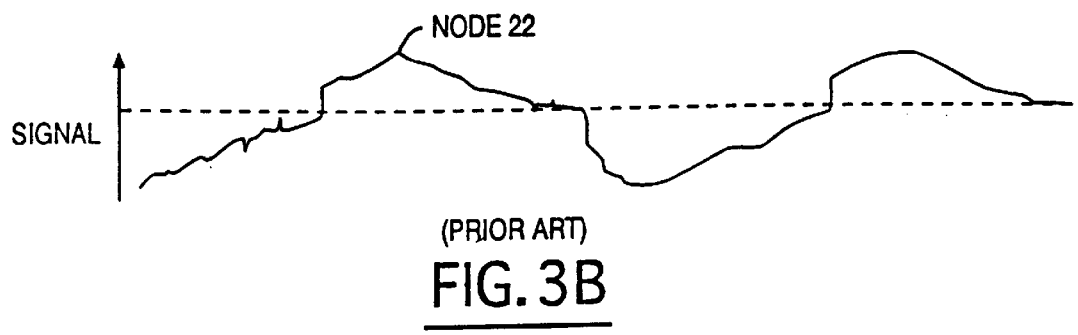

The operation of the circuitry shown in FIG. 2, including microcomputer 12, is now described with references to the associated wave forms shown in FIGS. 3A–3D. Initial conditions are shown before time $t_0$ when the input 16 is recognized as a logic "1" and feedback output 14 of microcomputer 12 is at a logic "0". During this time, node 34 is essentially at ground potential such that a portion of the electrical energy or current applied to node 22 from signal $V_s$ flows through resistor 30 to ground via the feedback output 14. Thus, the electrical signal at node 22, as shown in FIG. 3B, is both proportional to signal $V_s$ and diminished by the current flowing through resistor 30.

Figure 3C:
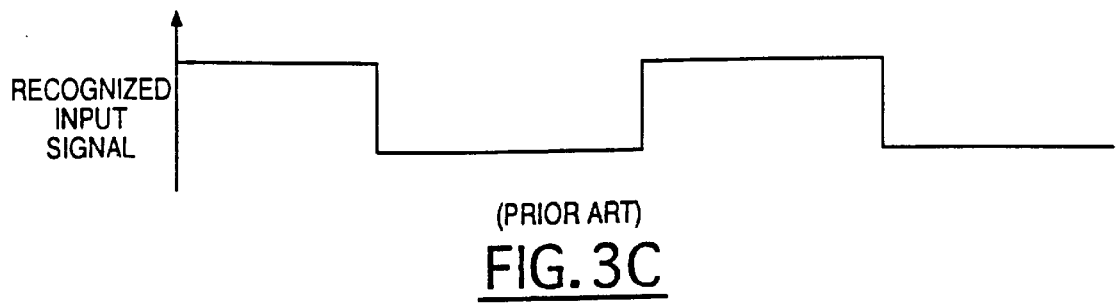
Figure 3D:
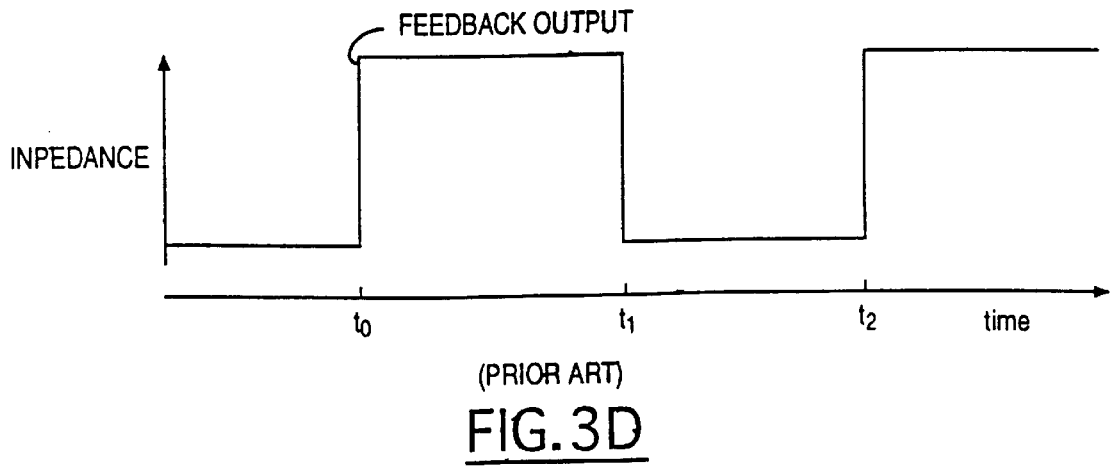

Referring to FIGS. 3A and 3B, the diminished signal at node 22 increases in response to an increasing signal $V_s$ thereby turning on transistor 20 at time $t_0$. As transistor 20 turns on in response to base current flowing from node 22, the voltage at node 24 is pulled down through the dynamic impedance of transistor 20 towards ground. As the voltage at input 16 falls below $\frac{1}{2}V_p$, microcomputer 12 recognizes it as a logic "0" (FIG. 3C). In response, microcomputer 12 switches feedback output 14 to a high impedance. Resistors 30 and 32 are thereby connected directly in series between $V_p$ and node 22. Accordingly, the electric signal present at node 22 is now intensified by current flowing through resistors 30 and 34. This intensified signal is shown in FIG. 3B between times $t_0$ and $t_1$. Stated another way, the signal at node 22, which is proportional to signal $V_s$, is abruptly offset in the positive direction in response to feedback output 14 switching to a high impedance state after time $t_0$. As signal $V_s$ decreases, the intensified signal at node 22 also decreases until transistor 20 turns off at time $t_1$. The voltage at node 24 then rises towards $V_p$ resulting in recognition by microcomputer 12 of a logic "1" at input 14. In response, microcomputer 12 switches feedback output 14 to the logic "0" state as shown in FIG. 3D.

Referring to the present invention as illustrated in FIG. 1, a circuit with hysteresis also is shown for converting an analog signal into a logic signal similar to that described above relative to FIG. 2. This circuit, then, is similar to that described in relation to FIG. 2, with some noted differences. Those similar elements are similarly designated, but with an added prime. For this embodiment, the microcomputer 12' is also used to bias the circuit to account for different types of sensors. The ability of this microcomputer 12' to bias the circuit allows for reduced complexity by not requiring the population or depopulation of components in the circuit.

The microcomputer 12' now includes a biasing output 50 (a configurable port of the microcomputer 12') in addition to the feedback output 14' and the input 16'. The port 50 can be selected as an output biased low or selected as a high impedance input. The microcomputer for example can be an off-the-shelf device sold by Motorola as part number MC68HC05P18. An EEPROM 52 is connected to the biasing output 50 and is configured at the module manufacturing plant, so the port 50 can be later selected for either of the options.

The microcomputer 12' couples to signal $V_s$ through the circuitry described in greater detail hereinafter. A speed sensor 54 coupled to the engine drivetrain (not shown) generates the analog signal $V_s$ having a frequency related to vehicular speed. This sensor 54 may be, for example, a sine wave type, AC coupled sensor, such as a variable reluctance sensor, or a square wave type, DC coupled sensor, such as a Hall Effect sensor, depending upon the particular vehicle in which it is employed. These two types of sensors require that the hardware of the circuit operate differently, and thus create the need for multiple circuit configurations.

The microcomputer 12' connects to the conventional power source $V_p$ and ground. The feedback output 14' provides a two state output responsive to the microcomputer input 16', with a resulting signal from the microcomputer 12' being a square wave 180 degrees out of phase with the input 16'. The feedback output 14' is set near ground potential when the input 16' is at logic "1" and set near $V_p$, when input 16 is at logic "0".

The biasing output 50 connects to the base of a switching transistor 20', through a resistor 56, via node 58. The transistor 20' also includes an output connector electrode connected to a node 24', and another output or emitter electrode connected to the signal ground 18. Node 58 is also shown connected to signal $V_s$ via two series resistors 28' and 60. The resistor 30' connects between node 34' and the feedback output 14' of the microcomputer 12'. Connected in parallel between the base of the transistor 20' and ground 18 are a diode 62 and a pair of capacitors 64 and 66.

Resistor 56 acts to connect (i.e., populate) the base of the switching transistor 20' to microcomputer 12', output 50, in order to provide biasing so the circuit is compatible with different signals. The biasing output 50 can be selected as an output biased low, effectively creating the "populated" condition, or selected as a high impedance input, effectively creating the "depopulated" condition. Since the microcomputer 12' has the programmable EEPROM 52, which is configured at the module manufacturing plant, the biasing output 50 can be selected for either of the options. This prevents the complexity issue of having to manufacture two different types of hardware (i.e., both "populated" and "depopulated" modules) for different vehicles to be able to process two different types of input signals for the particular speed sensor 54 employed. Thus, once the microcomputer 12' is programmed at the factory, the operation of the microcomputer 12' applies the correct bias voltage to the transistor 20' when the circuit begins to operate.

An example of the values for the inputs and hardware of the circuit of FIG. 1 is where the applied voltage $V_p$=5.1 Volts, capacitors 64 and 66=0.022 µF, resistor 28'=2KΩ, resistor 30'=22KΩ, resistor 38'=5.1KΩ, resistor 56=1KΩ, and resistor 60=6.2KΩ. The variable reluctance sensor would operator from −4V to 30 4V with the port 50 set as low impedance output mode. The exemplary microcomputer 12' discussed above is connected to this circuit to be operable with the desired hysteresis, only needing the correct programming for the EEPROM 52 to apply the correct bias.

Figure 4:
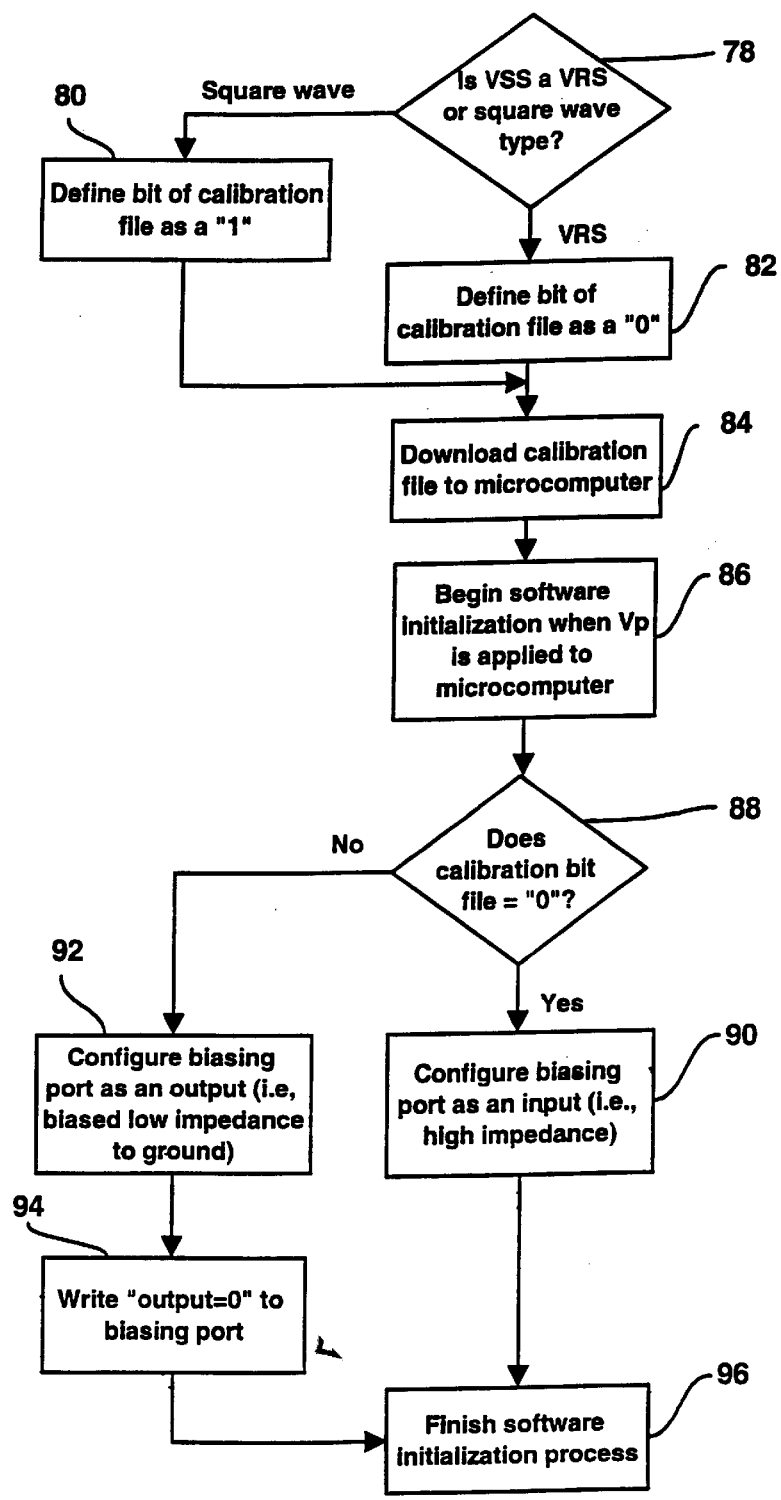
FIG. 4 is a flow chart representing the sequential steps performed by an EEPROM cooperating with the circuit of the present invention.

Referring to FIG. 4, which reflects the programming logic in the EEPROM 52 of FIG. 1, the signal processing configuration biasing is initiated in decision block 78 depending on whether the Vehicle Speed Sensor (VSS) is of the VRS or square wave type sensor. The initialization process (beginning with block 86 as discussed below) illustrated in this flow chart occurs each time the vehicle is started, although the input as to the type of sensor and storage of a calibration bit file is only input once, at the manufacturing facility.

If the VSS is of the square wave type, a bit in the calibration file is defined as a logic "1" in a block 80. On the other hand, if the VSS is of the VRS type, the bit is defined as a logic "0" in a block 82. This logic signal is then stored to the microcomputer at a block 84. The software is initialized as a block 86 when voltage $v_p$ is applied, i.e., when the vehicle is started. During software initialization, the logic value of the calibration bit is determined at decision block 88, and the microcomputer port (element 50 in FIG. 1) is set as a high impedance input at a block 90 or as an output biased low at a block 92. If the microcomputer port is set for input, the software initiation process continues until an end block 96. If the microcomputer port is set for output, a logic "0" (low impedance to ground) is first sent to the output port 94 before the software initiation process continues until end 96.

This now creates a circuit which can operate with two different vehicle speed signals; for example a variable reluctance sensor (VRS), or a Hall Effect Sensor as discussed above. The setting for the EEPROM is stored at the factory depending upon the sensor used for that particular vehicle. Upon vehicle startup, the circuit is initialized to the proper setting for the particular sensor in that vehicle and the analog to digital conversion with hysteresis takes place as described with reference to FIG. 2.

This concludes the description of the preferred embodiments. Variations and modifications may be apparent to those skilled in the art. Such variations and modifications which rely upon the disclosure of this invention are properly considered within the scope of the following claims.

We claim:

1. A method for programmable biasing of an analog to digital conversion circuit comprising the steps of:

biasing an analog signal conversion circuit including a resistor always populated and connected between the base of a switching transistor and a configurable port of a microcomputer;

selecting the microcomputer port as one of either an output biased low, effectively creating the populated condition, and a high impedance input, effectively creating a depopulated condition; and moving a biasing point by changing the configuration of a resistor divider output.

2. A method of operating an analog to digital conversion circuit employed in a speed sensing system, having one of two types of speed sensors, comprising the steps of:

populating a resistor between a base of a switching transistor and a configurable port of a microcomputer;

defining a bit of the microcomputer as a first value if the speed sensor is a first of the two types and defining the bit of the microcomputer as a second value if the speed sensor is the other of the two types of speed sensors;

downloading the value of the bit;

reading the value of the bit when a voltage is applied to the microcomputer;

configuring the configurable port as a high impedance input if the bit is defined as the first value; and configuring the configurable port as a low impedance output if the bit is defined as the second value.

3. The method of claim 2 further including the steps of:

receiving a speed signal;

adding electrical energy to the speed signal in response to a first state of feedback control signal to generate an intensified signal;

subtracting electrical energy from the speed signal in response to a second state of the feedback control signal to generate a diminished signal;

detecting a first input state of the speed signal when the diminished signal exceeds a predetermined value and generating the first state of the feedback control signal in response thereto; and detecting a second input state of the signal when the intensified signal falls below the predetermined value and generating the second state of the feedback control signal by the microcomputer in response thereto.

4. The method of claim 2 further comprising providing a variable reluctance sensor when the bit of the microcomputer is defined as the first value.

5. The method of claim 2 further comprising providing a square wave sensor when the bit of the microcomputer is defined as the second value.

* * * * *